United States Patent [19]

Oh

[11] Patent Number: 5,499,317
[45] Date of Patent: Mar. 12, 1996

[54] AUDIO MESSAGE STORING CIRCUIT AND CONTROL METHOD THEREFOR

[75] Inventor: Yong K. Oh, Seoul, Rep. of Korea

[73] Assignee: Goldstar Co., Ltd., Seoul, Rep. of Korea

[21] Appl. No.: 238,347

[22] Filed: May 5, 1994

Related U.S. Application Data

[63] Continuation-in-part of Ser. No. 800, Jan. 4, 1993, abandoned, which is a continuation of Ser. No. 752,995, Sep. 3, 1991, abandoned, which is a continuation of Ser. No. 400,879, Aug. 30, 1989, abandoned.

[30] Foreign Application Priority Data

Aug. 30, 1988 [KR] Rep. of Korea .................. 11041/1988

[51] Int. Cl.$^6$ ..................................................... G10L 9/00
[52] U.S. Cl. ..................................................... 395/2.79
[58] Field of Search .................................. 395/2.79, 2.84, 395/2.87, 2.1; 360/33.1, 37.1, 36.2, 48, 49, 52, 55

[56] References Cited

U.S. PATENT DOCUMENTS 4,368,988  1/1983  Tahara et al. ........................ 381/43
4,389,541  6/1983  Nakano et al. ...................... 381/36
4,701,862  10/1987  Washizuka et al. ................. 381/51

OTHER PUBLICATIONS

LeBoss, "Speech I/O Is Making Itself Heard", Electronics, May 22, 1980, vol. 53, No. 12, pp. 95–106.

*Primary Examiner*—Allen R. MacDonald
*Assistant Examiner*—Michelle Doerrler

[57] ABSTRACT

An audio message storing circuit and a control method thereof in a timer program of a video cassette recorder for recording an audio information simultaneously with the timer program and outputting the stored audio information when the present time is equal to a programmed time. The audio message storing circuit uses a key matrix, a timer, a communication processor, a microphone, a analog/digital converter, a random access memory, a gate and hold circuit, a digital/analog converter, a low band pass filter, an amplifier, and an audio recording circuit coupled to a record/playback head of the video cassette recorder. The method is carried out by the steps of storing the audio information in the random access memory, setting a timer program, and reading the stored information sequentially. The audio signal is outputted to the record/playback head of the recorder when the present time is equal to the programmed time.

1 Claim, 4 Drawing Sheets

AUDIO MESSAGE STORING CIRCUIT AND CONTROL METHOD THEREFOR

This application is a continuation-in-part, of application Ser. No. 08/000,800 filed on Jan. 4, 1993, now abandoned, which is a rule 62 continuation of Ser. No. 07/752,995, filed Sep. 3, 1991, abandoned, which is a rule 62 continuation of Ser. No. 07/400,879, filed Aug. 30, 1989, abandoned.

BACKGROUND OF THE INVENTION

1. Field of the Invention

The present invention relates to a program recording system for a video cassette recorder, and more particularly, to an audio message storing circuit and a control method thereof in which a user may record directly audio information and easily output this information at a desired time.

2. Description of the Prior Art

In general, various types of video cassette recorders are designed to play back a pre-recorded tape and record other video signals to a tape. And recently, such video cassette recorders are developed and have become to record the content of the broadcasting programs not presently viewed. Such video cassette recorders are provided with a timer program recording function in which the time required for recording is previously set and the recording is automatically carried out at the set time. Furthermore, such video cassette recording are provided with the function that a number of time bands are set and automatically execute the video recording in the sequence of the set time program.

On the other hand, when an audio signal from a user is previously stored by the video cassette recorder and the stored audio signal is output at the programmed recording time, it becomes possible to provide more convenience for the user. However, such functions are not provided in the conventional video cassette recorders.

SUMMARY OF THE INVENTION

Accordingly, it is an object of the present invention to provide an audio message storing circuit and a control method thereof in which a timer program is set, and at the same time, audio information from a user is previously stored in a memory. When the time is equal to the program set time, the stored audio information can be outputted to a video cassette tape recorder.

Another object of the present invention is to provide a program recording system for setting a timer program, converting audio information from a user being input from a microphone into a digital signal and storing it in a memory, reading the digital signal stored in the memory when the time is equal to the program set time, holding the digital audio signal and converting it to analog signal, filtering an audio signal converted from the analog signal through a low pass filter, and amplifying it before outputting to an audio track of a tape in video recorder.

Other objects and further scope of applicability of the present invention will become apparent from the detailed description given below. It should be understood, however, that the detailed description and specific examples, while indicating preferred embodiments of the present invention, are given by way of illustration only, since various changes and modifications within the spirit and scope of the present invention will become apparent to those skilled in the art from this detailed description.

Briefly described, the present invention relates to an audio message storing circuit and a control method thereof for a timer program of a video cassette recorder for recording audio information simultaneously with the timer program and outputting the stored audio information when the time is equal to a programmed time to an audio track of a video tape which comprises a key matrix, a timer microcomputer, a communication processor, a microphone, a analog/digital converter, a RAM, a gate and hold circuit, a digital/analog converter, a low band pass filter, an amplifier, and audio recording and playback circuitry coupled to the record/playback head of a video tape recorder. The control method comprises the steps of storing the audio information in a RAM by converting the audio signal into a digital, setting the timer program, and reading the stored information sequentially and before converting it to an analog signal and outputting it to an audio track of a video tape of a video cassette tape recorder when the time is equal to the programmed time.

BRIEF DESCRIPTION OF THE DRAWINGS

The present invention will become more fully understood from the detailed description given below and the accompanying drawings which are given by way of illustration only, and thus are not limitative of the present invention, and wherein.

DESCRIPTION OF THE PREFERRED EMBODIMENTS

Figure 1:
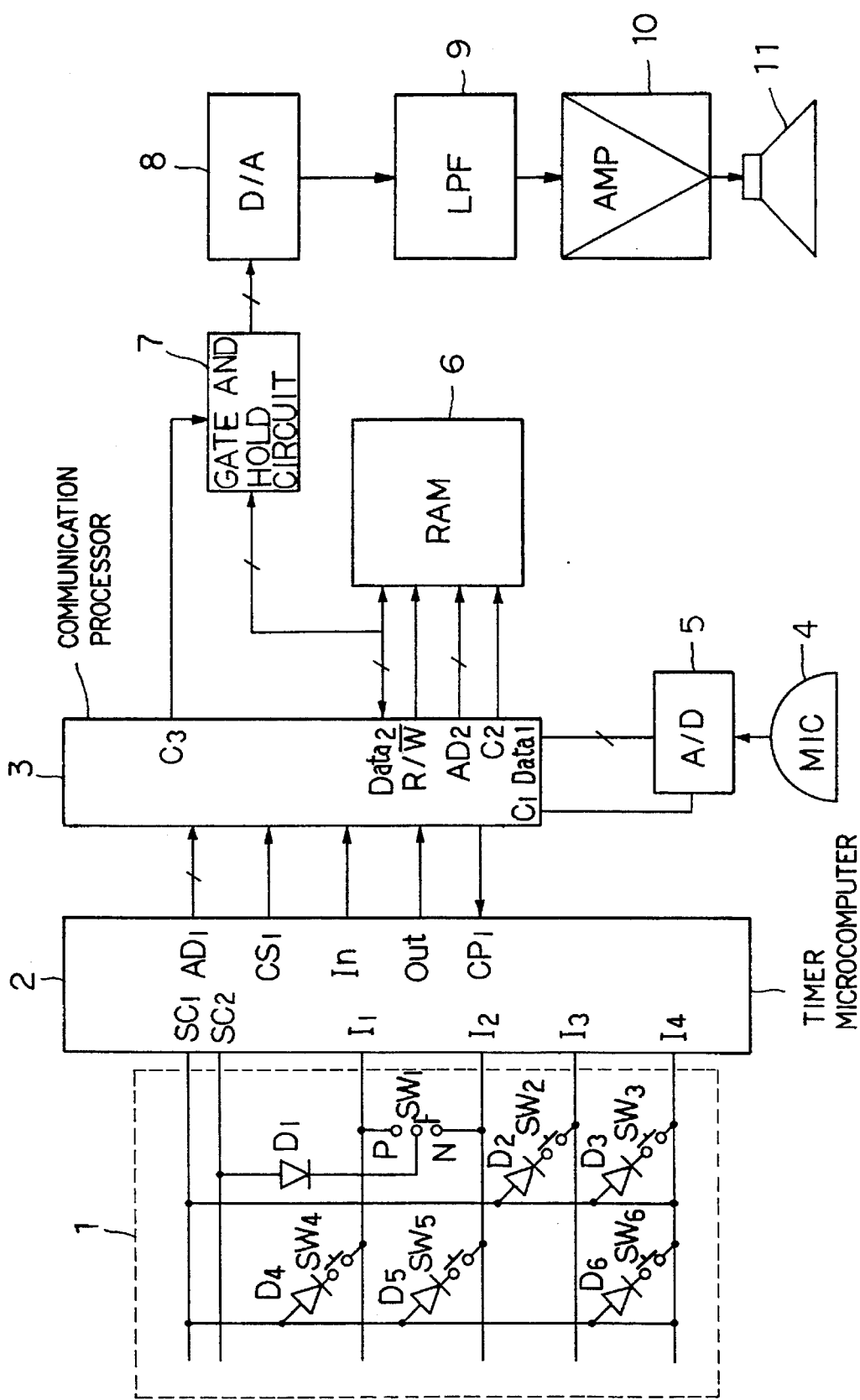
FIG. 1 is a block diagram view illustrating an audio message storing circuit according to the present invention.

Referring now in detail to the drawings for the purpose of illustrating the preferred embodiments of the present invention, the audio message storing circuit as shown in FIG. 1 comprises a key matrix 1 for executing a key input, a timer microcomputer 2 for executing various control functions in response to the input of the key signals of the key matrix 1, a coprocessor microcomputer 3 for controlling the writing and reading of audio signal data in response to the timer microcomputer 2, a microphone 4 for converting the audio signal into an electric signal, a analog/digital converter 5 for converting the output of the microphone 4 into a digital signal of 8 bits in response to the communication processor and for applying the digital of 8 bits to the communication processor 3, a RAM 6 for storing the audio signal data being inputted from the analog/digital converter 5 through the communication processor 3, a gate and hold circuit 7 for transmitting the audio signal data read from the RAM 6 in response to the communication processor 3, a digital/analog converter 8 for converting the output signal of the gate and hold circuit 7 into an analog signal, a low band pass filter 9 for filtering the signal to have only a low frequency band, a switch 10 controlled by the timer microcomputer 2, a digital audio signal recording circuit 11, a playback circuit 12, and read/playback head 15 of a video cassette tape recorder, not shown, an amplifier 10 for amplifying the output signal of the low band pass filter 9, and a speaker 11 for outputting the output signal of the amplifier 10 as an audio signal. The key matrix 1 includes a slide switch SW1 for switching the system between a program state or a normal state, a program number key SW2 for increasing a program number, an hour key SW3 and a minute key SW4 for setting the time, a memory key SW5 for instructing the recording of the audio signal data, and a transmission message key SW6 for instructing the transmission of the audio signal data.

One or more audio messages are stored in the RAM 6 through the microphone 4 during program-recording and the audio data stored in the RAM is fed out and digital-to-analog converted and then recorded in an audio track of a video tape, not shown, at the same time video program-recording is initiated. During a playback operation, the video program which has been recorded on the video cassette tape recorder is reproduced and an audio message recorded on the audio track is outputted as well. At this moment, the corresponding audio message has been stored in the RAM 6 is erased.

Figure 2A:
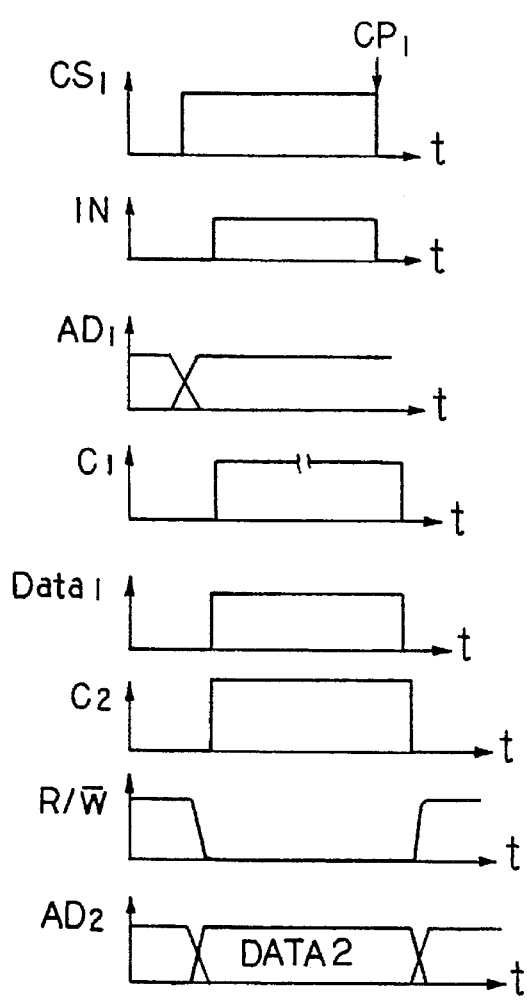
FIG. 2A and 2B are waveform charts illustrating output waveforms representing operation of each related portion of FIG. 1, respectively.
Figure 2B:
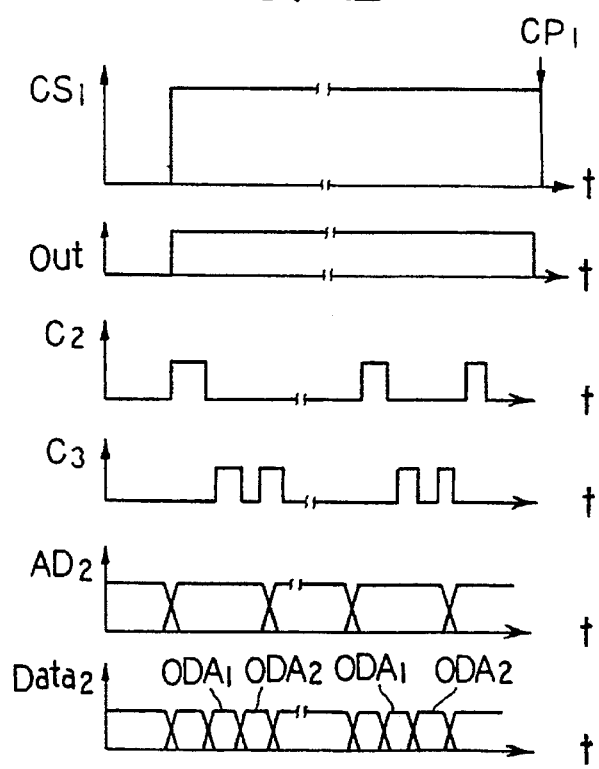
Figure 3:
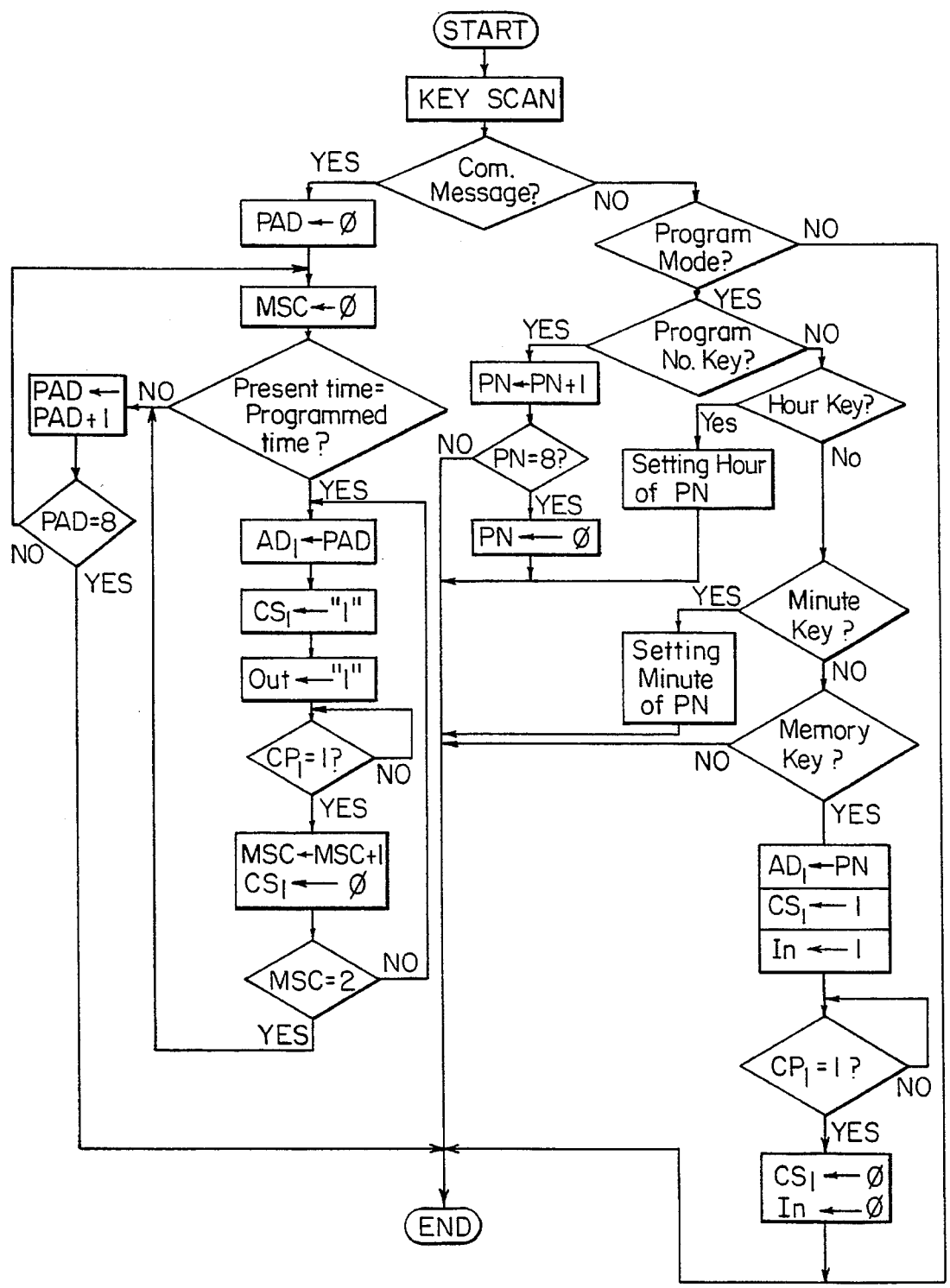
FIG. 3 is a flow chart illustrating the control process of the timer microcomputer of FIG. 1.
Figure 4:
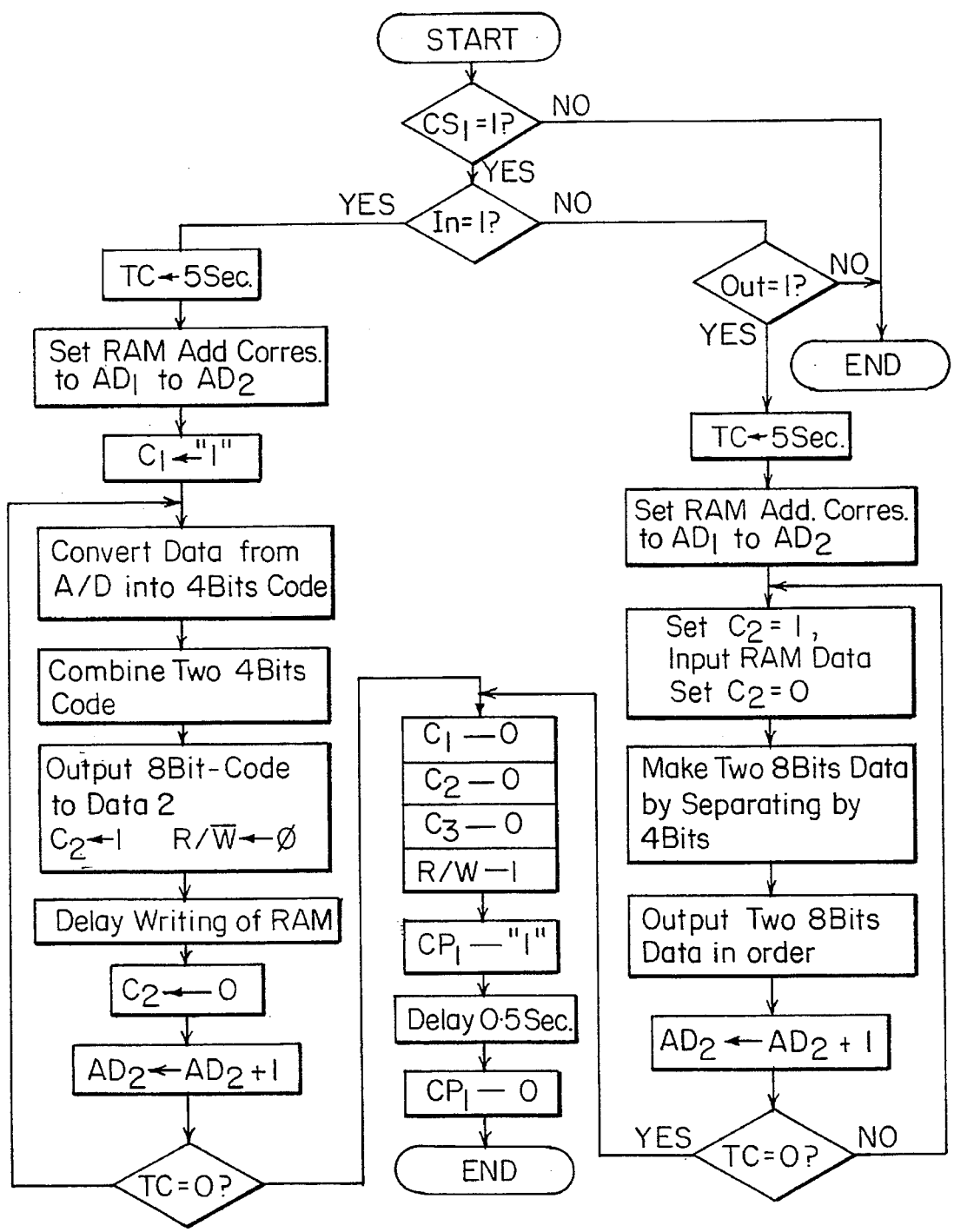
FIG. 4 is a flow chart illustrating the control process of the transmitting processor of FIG. 1.

FIGS. 2A and 2B are waveform charts of output waveforms illustrating the operation of each related portions of FIG. 1 wherein FIG. 2A shows waveforms charts of the outputs of the timer microcomputer 2 and communication processor 3 at the time of recording the audio signal data in the RAM 6 and FIG. 2B shows waveform charts of the outputs of the timer microcomputer 2 and communication processor 3 at the time of reading the audio signal data from the RAM 6. FIG. 3 is a flow chart illustrating the control the process of timer microcomputer 2 in response to a key input of the key matrix 1 and FIG. 4 is a flow chart illustrating the control process of the communication processor 3 in response to the timer microcomputer 2.

According to the present invention, the audio message storing circuit operates as follows:

As shown in FIGS. 1–4, the timer microcomputer 2 outputs a scan signal at scan signal output terminals $SC_1$ and $SC_2$ and searches the signal of the input terminals $I_1$ and $I_4$ so that the key signals of the key matrix 1 can be detected. The key matrix 1 is searched by the timer microcomputer 2 in this manner and the control process is executed as in the flow chart of FIG. 3. That is, under a state when the program switch SW1 is set to a program terminal P and the transmission message key SW6 is not set, the microcomputer 2 detects this state and enters the message setting mode.

When the program number key SW2 is pressed during this state, the timer microcomputer 2 increases the program number PN by "1". At this time, the timer program is set by the timer microcomputer 2 in accordance with the pressing of the hour key SW3 and minute key SW4. As shown FIG. 2, when the memory key SW5 is pressed in to write the audio signal data during this state, the timer microcomputer 2 realizes the state of the memory key SW5, and the address signal, in accordance with the program number PN, is outputted to the address signal terminal AD1. A high signal is outputted to the communication processor signal terminal CS1 and inputted at control signal terminal IN.

Accordingly, at this time, the coprocessor microcomputer receives and writes the audio signal data as shown in flow chart of FIG. 4. That is, the microcomputer 3 sets a predetermined time TC, for example, 5 seconds, to its interior time counter, and thereafter, the address signal according to the address signal being outputted from the timer microcomputer 2 is outputted to the address signal terminal AD2 and designates the starting address of the RAM 6. The high signal is outputted to the control signal terminal C1 as shown in FIG. 2A to operate the analog/digital converter 5. As a result, the outputted audio signal of the microphone 4 is converted into a digital signal of 8 bits by the analog/digital converter 5 and applied to the data terminal, Data 1, of the microcomputer 3. At this time, the microcomputer 3 sequentially receives the signals applied to its data terminal, Data 1. For example, its receives three datum DA1, DA2, and DA3 sequentially and seeks the differences of DA1 and DA2, DA3 and DA3 respectively. The two difference signals sought are converted respectively into the 4 bit code and these are combined to produce 8 bit code data, and this 8 bit code data are outputted to the data terminal, Data 2, and applied to the RAM 6. Furthermore, at this time, the high signal, as shown in FIG. 2A is outputted from the microprocessor 3 to the control signal terminal C2. A low signal is outputted to the read and write control signal terminal R/W, the 8 bit code data are outputted to the data terminal, Data 2, and are written at the designated address of the RAM 6. Thereafter, the microcomputer 3 outputs a low signal to the control signal terminal C2, and the address signal which is outputted to the address signal terminal AD2 is increased by "1". Thereafter, the digital signals are received from the analog/digital converter 5 by the method as mentioned above and converted to 8 bit code data before being written again to the designated address of RAM 6. The operation as above is repeated during the predetermined time period TC. Therefore, the audio signal which is inputted through the microphone 4 during the predetermined time period TC is converted sequentially to 8 bits code data and written at the designated address of the RAM 6.

When the predetermined time counting TC is completed, the time count completion signal is outputted and applied to the terminal CP1 of the timer microcomputer 2. The timer microcomputer 2 outputs a low signal to the control signal terminal CS1 and the input control signal terminal IN, as shown in FIGS. 2A and 3, and finishes the write control operation of the audio signal data.

On the other hand, when the transmission message key SW6 is set, the timer microcomputer 2 executes the transmission control operation of the audio signal data as shown in the flow chart of FIG. 3. That is, at this time, the timer microcomputer 2 set program address PAD to "0", and the number of the transmission MSC to "0". Thereafter, the timer microcomputer 2 determines whether or not the present time is equal to the programmed time in accordance with the program address PAD. If it is not equal, the timer microcomputer 2 increase the program address PAD by "1" and then determines again whether or not that the present time is equal to the programmed time in accordance with a program address PAD.

These processes are executed repeatedly until the program address PAD becomes "8". On the other hand, when the present time is equal to the programmed time in accordance with the program address PAD, the program address PAD is outputted to the address signal terminal AD1. At the same time, a high signal is outputted to the co-processor microcomputer 3 by the communication processor control signal terminal CS1 and the output control signal terminal OUT, as shown in FIG. 2B. Therefore, the microcomputer 3 reads the audio signal data written in the RAM 6 and begins to transmit. The microcomputer 3 sets the predetermined time period, TC, for example, to 5 seconds, in a counter and then outputs the address signal in accordance with the address signal being outputted from the address signal terminal AD1 of the timer microcomputer 2 and designates the address of RAM 6. Thereafter, a high signal is outputted to the control signal terminal C2, as shown in FIG. 2B, and reads out the 8 bit code data written at the designated address of the RAM 6. Thereafter, a low signal is outputted to control signal terminal C2 as shown in FIG. 2B.

Since the 8 bit code data read out from the microcomputer 3 are the combination of two 4 bit data, it divides the 8 bit code data into two 4 bit data and then determines the difference of previous 8 bits' signal before converting the signals to two 8 bit data ODA1 and ODA2. Thereafter, the co-processor microcomputer 3 outputs 8 bit data ODA1, as shown in FIG. 2B, and at the same time a high signal is outputted to the control signal terminal C3. As result, the 8 bits' data ODA1 is input to the gate and hold circuit 7 and applied to the digital/analog converter 8. Thereafter, the microcomputer 3 outputs a low signal to the control signal terminal C3 and then outputs again 8 bit data ODA1. At the same time, a high signal is outputted to control signal terminal C3, thereby, the 8 bit data ODA2 are inputted to the gate and hold circuit 7 and applied to the digital/analog converter 8.

The microcomputer 3 increases the address signal which is outputted to the address signal terminal AD2 by "1" and executes the process repeatedly during the predetermined time period TC. On the other hand, the data signal applied to the digital/analog converter 8 is converted to an analog signal and is outputted to the speaker 11 through the low band pass filter 9 and amplifier 10.

Furthermore, when the predetermined time period TC is completed, the count completion signal is outputted and applied to the terminal CP1 of the timer microcomputer 2. As a result, the timer microcomputer 2 increases the number of the transmission MSC by "1" and at the same time, a low signal is outputted to control signal terminal CS1, as shown in FIG. 2B.

The timer microcomputer 2 determines whether or not the transmission number MSC is "2". When the MSC is not equal to "2", the timer microcomputer 2 outputs again the program address PAD to its address signal terminal AD1. A high signal is outputted to the control signal terminal CS1 and the output control signal terminal OUT. Therefore, at this time, the microcomputer 3 reads again the 8 bit data from the RAM 6 and then transmits it through the gate and hold circuit 7. Thus, when the microcomputer 3 determines that predetermined time period TC has been completed, the count completion signal is outputted and applied to the terminal CP1 of the timer microcomputer 2.

Therefore, the timer microcomputer 2 increases the transmission number MSC by "1", and a low signal is outputtted to the chip selection signal terminal CS1. Thereafter, the timer microcomputer 2 determines whether or not the transmission number MSC is "2". When the MSC is equal to "2", the timer microcomputer 2 executes repeatedly the process by increasing the program address PAD by "1".

According to the present invention, the timer program is set, at the same time, the audio information of a user is stored in a memory and the audio information is outputted at the established program time. A user can store the desired audio information in conformity with the programmed recording time of the video cassette recorder. Therefore, there is advantage that another more useful function can be given thereto than the conventional timer program recording only.

The invention being thus described, it will be obvious that the same may be varied in many ways. Such variations are not to be regarded as a departure from the spirit and scope of the invention, and all such modifications as would be obvious to one skilled in the art are intended to be included in the scope of the following claims.

What is claimed is:

1. A method for storing and playing back a plurality of different audio messages for a plurality of time designations in a video cassette tape recorder, comprising the steps of (a) inputting instructions through a key matrix;

(b) entering a message setting mode when a slide switch of the key matrix is located at a program position;

(c) increasing a program number by 1 in response to instructions received when step (b) has been executed;

(d) setting a program time for the program number by setting an hour key and a minute key;

(e) outputting an address signal in accordance with the program number by setting a memory key;

(f) entering a message transmission mode when a transmission message key is set and a present time is equal to a programmed time;

(g) outputting a program address;

(h) entering a recording mode and setting a predetermined time when instructions are received;

(i) designating a start address for a random access memory having a plurality of storage locations which are sequentially accessible;

(j) applying an audio message signal to an analog to digital converter and generating digital data from said message signal;

(k) applying said digital data to a signal processor in the form of three sequential data codes comprised of m-bits each, generating two difference data codes therefrom of n-bits and thereafter combining the two n-bit difference data codes into an m-bit bit output data code, where m and n are integers;

(l) applying the m-bit output data code and a record control signal to said random access memory;

(m) writing said m-bit output data code to a designated address;

(n) increasing an address of the random access memory by 1 until a predetermined time period has elapsed;

(o) generating a count completion signal when the predetermined time period has elapsed;

(p) executing program-recording by sequentially repeating said steps (i), (j), (k), (l), (m), (n), and (o) such that a plurality of audio messages are stored in sequential storage locations of said random access memory without regard to the amount of message information included in said code data for a plurality of specified time designations;

(q) thereafter entering a transmission mode and setting a predetermined time;

(r) designating a start address for the random access memory;

(s) applying the driving control signal to the random access memory;

(t) reading out the m-bit output data code stored at said designated address to said signal processor at said predetermined time designation, dividing the m-bit output data code into two n-bit data codes, and generating the original m-bit data code therefrom;

(u) applying the original m-bit data code to a digital to analog converter to generate an audio message signal;

(v) applying the audio message signal from said random access memory to an audio record circuit and then recording the audio message signal on an audio track of a video tape;

(w) increasing the address of the random access memory by 1 until the predetermined time has elapsed;

(x) generating a count completion signal; and (y) repeating steps (r), (s), (t), (u), (v), (w) and (x), so that a predetermined audio message stored on said video tape is read out and played back with a video recording in conformity with the programmed recording time of the video cassette tape recorder.

* * * * *